US008736645B2

(12) United States Patent
Leoni et al.

(10) Patent No.: US 8,736,645 B2
(45) Date of Patent: May 27, 2014

(54) PRINTHEAD FABRICATION METHODS AND PRINTHEADS

(75) Inventors: Napoleon J. Leoni, San Jose, CA (US); Omer Gila, Cupertino, CA (US); Cary G. Addington, Albany, OR (US); Paul H. McClelland, Monmouth, OR (US); Henryk Birecki, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 194 days.

(21) Appl. No.: 13/382,805

(22) PCT Filed: Jul. 8, 2009

(86) PCT No.: PCT/US2009/049949
§ 371 (c)(1),
(2), (4) Date: Jan. 6, 2012

(87) PCT Pub. No.: WO2011/005256
PCT Pub. Date: Jan. 13, 2011

(65) Prior Publication Data
US 2012/0113206 A1 May 10, 2012

(51) Int. Cl.

| | |
|---|---|
| ***B41J 2/39*** | (2006.01) |
| ***B41J 2/395*** | (2006.01) |
| *B21D 53/00* | (2006.01) |
| *B29C 65/00* | (2006.01) |
| *B32B 37/00* | (2006.01) |
| *G05G 15/00* | (2006.01) |
| *H01L 21/30* | (2006.01) |
| *H01L 21/46* | (2006.01) |

(52) U.S. Cl.
USPC ........... 347/141; 29/890.1; 156/349; 438/455

(58) Field of Classification Search
USPC ........... 347/141; 29/890.1; 156/349; 438/455
See application file for complete search history.

(56) References Cited

U.S. PATENT DOCUMENTS

| | | | | |
|---|---|---|---|---|
| 4,155,093 A | | 5/1979 | Fotland et al. | |
| 4,160,257 A | | 7/1979 | Carrish | |
| 4,408,214 A | * | 10/1983 | Fotland et al. | 347/128 |
| 4,679,060 A | * | 7/1987 | McCallum et al. | 347/127 |
| 4,954,313 A | | 9/1990 | Lynch | |
| 5,027,136 A | * | 6/1991 | Fotland et al. | 347/127 |
| 5,646,669 A | * | 7/1997 | Yamada et al. | 347/127 |
| 5,742,468 A | | 4/1998 | Matsumoto et al. | |
| 6,504,557 B2 | | 1/2003 | Kosyachkov et al. | |
| 6,506,332 B2 | | 1/2003 | Pedigo | |
| 7,623,144 B2 | * | 11/2009 | Fotland et al. | 347/123 |

(Continued)

FOREIGN PATENT DOCUMENTS

| | | | | |
|---|---|---|---|---|
| JP | 63270154 A | * | 11/1988 | B41J 3/18 |
| WO | WO-2011005255 | | 1/2011 | |

OTHER PUBLICATIONS

Dupont Pyralux LF Coverlay, Bondply, and Sheet Adhesive [online] downloaded from http://www2.dupont.com/Pyralux/en_US/products/adhesives_films/LF/LF_films.html on Sep. 10, 2013.*

(Continued)

*Primary Examiner* — Laura Martin
*Assistant Examiner* — Jeremy Bishop

(57) ABSTRACT

A printhead and related fabrication method are described with the printhead including a spacer layer.

18 Claims, 5 Drawing Sheets

(56) References Cited

U.S. PATENT DOCUMENTS

| | | | | |
|---|---|---|---|---|
| 2002/0097313 | A1 | 7/2002 | Kubelik | |
| 2003/0168145 | A1 * | 9/2003 | Suga et al. | 156/60 |
| 2008/0180510 | A1 | 7/2008 | Fotland et al. | |
| 2009/0033735 | A1 | 2/2009 | Leoni et al. | |

OTHER PUBLICATIONS

Dupont Pyralux LF Bond Ply Technical Information [online], downloaded from http://www2.dupont.com/Pyralux/en_US/tech_info/index.html#tb on Sep. 10, 2013.*

* cited by examiner

PRINTHEAD FABRICATION METHODS AND PRINTHEADS

BACKGROUND

Imaging devices capable of printing images upon paper and other media are ubiquitous and used in many applications including monochrome and color applications. The use and popularity of these devices continues to increase as consumers at the office and home have increased their reliance upon electronic and digital devices, such as computers, digital cameras, telecommunications equipment, etc.

A variety of methods of forming hard images upon media exist and are used in various applications and environments, such as home, the workplace and commercial printing establishments. Some examples of devices capable of providing different types of printing include laser printers, impact printers, inkjet printers, commercial digital presses, etc.

Throughput and cost per page are important attributes in some applications, for example, in some high-quality digital commercial press applications. Some configurations utilize an electrophotographic engine with laser based imaging and a photoconductor imaging plate. However, the scanning assemblies and photoconductor materials of some arrangements are limitations to increased operating speeds and imaging widths of the devices which may limit throughput.

At least some aspects of the disclosure are directed towards imaging apparatus and methods of fabricating imaging apparatuses which avoid some of the above-mentioned limitations.

DETAILED DESCRIPTION

The present disclosure describes printheads and methods of fabricating printheads and printhead substrate assemblies according to some embodiments. The printheads include a plurality of printhead structures in at least one embodiment. In a more specific example, a charge emitting printhead is disclosed which includes a plurality of printhead structures in the form of nozzles which are configured to eject electrons to form latent images upon a suitable imaging member for subsequent development during imaging operations of the printhead. Additional details regarding the example charge emitting printheads are described in U.S. Pat. Nos. 4,155,093 and 4,160,257 and U.S. Pat. Nos. 7,623,144 and 7,764,296. These printheads form latent images without use of a scanning assembly in one example. Aspects of the present disclosure may also be applicable to other types of printheads and the fabrication of such printheads.

Figure 1:
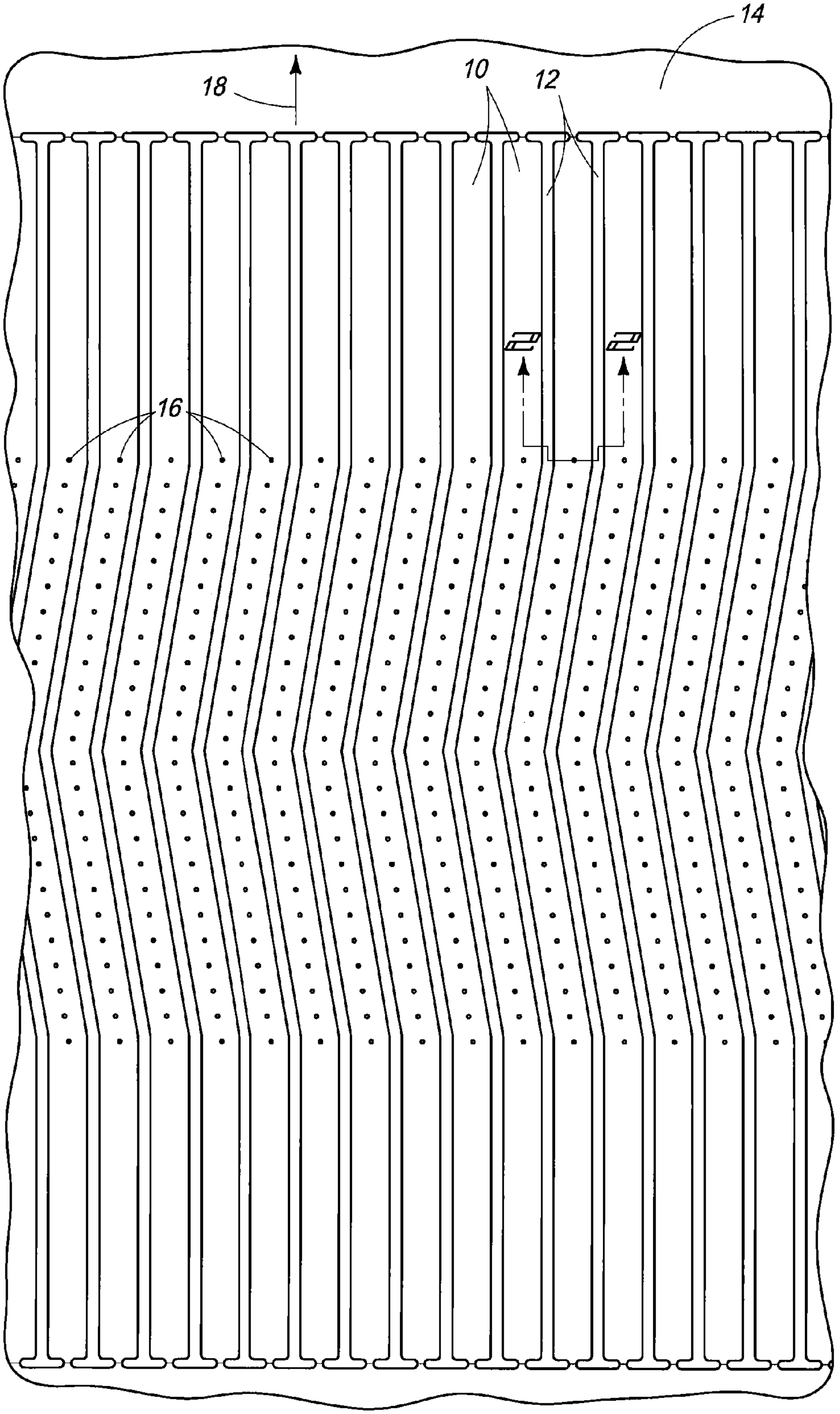
FIG. 1 is an illustrative representation of a plurality of bottom electrodes of a printhead according to one embodiment.

Referring to FIG. 1, a plan view of a plurality of bottom electrodes 10 which will be used to fabricate a charge emitting printhead is shown in one embodiment. A plurality of dielectric members 12 are formed intermediate respective ones of the bottom electrodes 10. The bottom electrodes 10 and dielectric members 12 may be formed upon a support mandrel 14 in one embodiment. In one embodiment, bottom electrodes 10 are electroformed upon the support mandrel 14. Support mandrel 14 may be a glass mandrel in one implementation. In one example, the bottom electrodes 10 are spaced at a pitch of approximately 1 mm. In one embodiment, bottom electrodes 10 are individually electroformed Nickel having a thickness of approximately 25 um with a sputtered Tantalum coating for corrosion protection of approximately 100-150 nm thick. In one embodiment, dielectric members 12 are formed from a liquid photoresist layer which has been cured, photo-patterned and developed and which is used to define the electroformed bottom electrodes 10.

Individual ones of the bottom electrodes 10 include a plurality of printhead features 16 which extend in a longitudinal direction of the respective bottom electrode 10 in the depicted embodiment. The printhead features 16 correspond to a plurality of printhead structures of the printhead to be subsequently formed in one embodiment. As discussed below, the printhead structures may include nozzles configured to eject electrons to form latent images in an embodiment where the printhead being processed is a charge emitting printhead. In such an example embodiment, the printhead features 16 may comprise openings.

The printhead features 16 of an electrode 10 may be offset from one another in a direction perpendicular to a process direction 18 in which media, such as paper, will move with respect to the subsequently formed printhead to provide the printhead having a desired resolution (e.g., 600 or 1200 dpi in some examples). In one embodiment, the printhead features 16 of the bottom electrodes 10 may be evenly spaced from one another between the printhead features 16 of the immediately adjacent bottom electrodes 10. Other configurations are possible.

Figure 2:
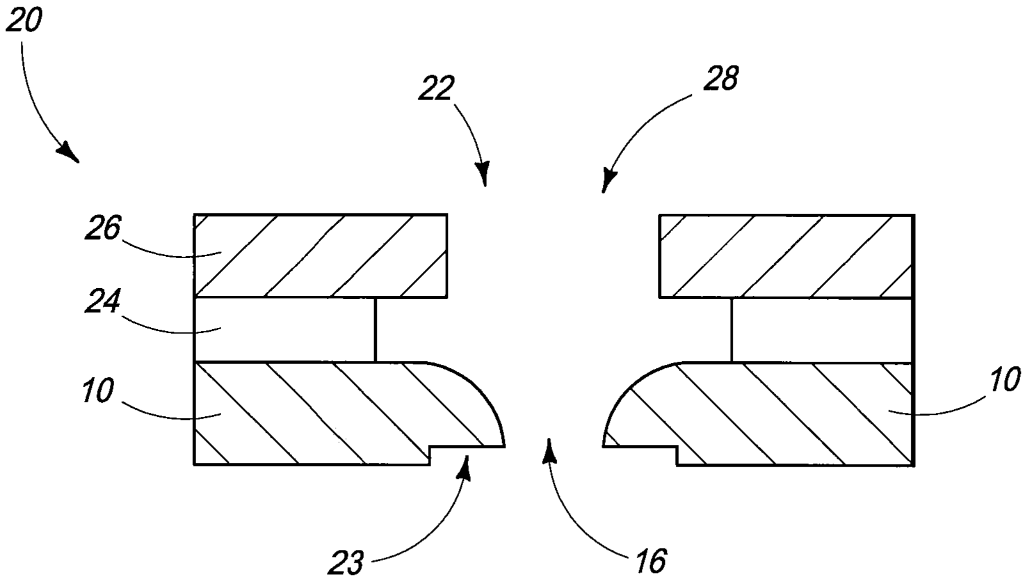
FIG. 2 is a cross-sectional view of a printhead structure of a printhead assembly taken along line 2-2 of FIG. 1 according to one embodiment.

Referring to FIG. 2, an example of a printhead structure 20 is shown. The printhead structure 20 comprises a nozzle 22 which includes bottom and top electrodes 10, 26 in the depicted embodiment and which may be referred to as discharge electrodes and screen electrodes, respectively, in one embodiment. As shown in FIG. 2, the illustrated bottom electrode 10 includes a plurality of undercuts 23 in one configuration. Undercuts 23 may have a height of approximately 5-20 microns and a length of approximately 5-17 microns in illustrative examples.

The printhead structure 20 also includes spacer material 24 intermediate the bottom and top electrodes 10, 26 in the illustrated arrangement. In one embodiment described below, the spacer material 24 may be provided in the form of a spacer layer 36 (FIGS. 3A-3D), which may comprise adhesive material which is electrically insulative in one embodiment. The spacer layer 36 has a plurality of printhead structures 38 (e.g., openings shown in FIGS. 3A-3D) in one embodiment.

The top electrodes 26 may be implemented using a continuous layer of conductive material over the spacer layer 36 and the bottom electrodes 10 and which layer includes a plurality of printhead features 28 (e.g., openings) corresponding to the nozzles 22 and provides the plural top electrodes 26 corresponding to the respective features 28.

According to one implementation, the spacer material 24 has a substantially uniform thickness of approximately 25 microns to evenly space the top electrodes 26 from the bottom electrodes 10 of the plural structures 20 of the printhead. The bottom and top electrodes 10, 26 may individually have a thickness of 25-30 microns in one embodiment. Furthermore, printhead features 16 may individually have a diameter in a range of approximately 25-125 microns (e.g., 33 microns in one embodiment), printhead features 38 may individually have a diameter of approximately 150 microns, and printhead features 28 may individually have a diameter of approximately 25-125 microns in one example embodiment.

Referring to FIGS. 3A-3D, a plurality of processing steps for fabricating a printhead assembly of a printhead are shown. FIGS. 3A-3D illustrate a fragment 30-30*c* of the printhead assembly at a plurality of intermediate processing acts for forming a printhead. More, less or alternative acts may be used in addition to the acts shown in FIGS. 3A-3D in other embodiments.

Figure 3A:
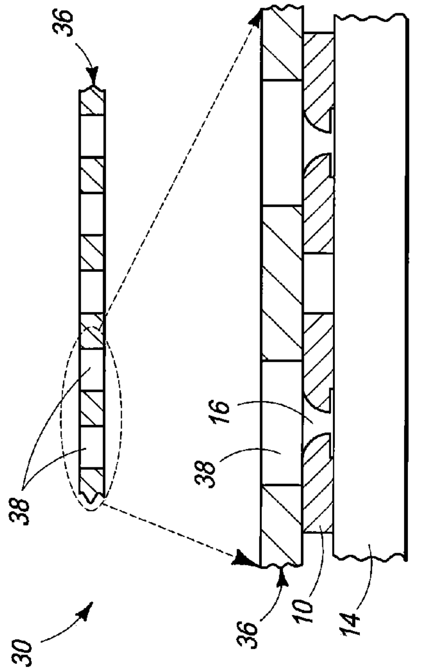
FIGS. 3A-3D are cross-sectional views of different acts of forming a printhead structure of a printhead according to one embodiment.

Referring to FIG. 3A, two printhead structures are shown being fabricated upon a support mandrel 14. Although not shown, other additional printhead structures are also provided upon the support mandrel 14 in one embodiment.

Following the provision of bottom electrodes 10 including printhead features 16 upon support mandrel 14, a spacer layer 36 may be provided over the bottom electrodes 10. In one embodiment, spacer layer 36 may be bonded with top and bottom electrodes 26, 10, and accordingly, spacer layer 36 may be implemented as an adhesive layer, such as a film adhesive layer. In one embodiment, the spacer layer 36 is b-staged acrylic based film adhesive and is electrically insulative. In one more specific example, the spacer layer 36 is a PYRALUX™ film adhesive available from E. I. DuPont de Nemours and Company and has a thickness of approximately 25 microns.

In one embodiment, the spacer layer 36 is patterned prior to application of the spacer layer 36 to the bottom electrodes 10. In one example, laser ablation patterning is utilized to form a plurality of printhead features (e.g., openings) 38 in the spacer layer 36 and which correspond to the printhead structures to be formed. Laser patterning is flexible and permits different types of adhesives to be used. Furthermore, other methods of patterning may be used to pattern the spacer layer 36 in other embodiments.

In one embodiment, the spacer layer 36 includes uncured and cured states. The pre-patterned spacer layer 36 comprising printhead features 38 may be provided over the bottom electrodes 10 in a substantially uncured tack-free state. The printhead features 38 of the spacer layer 36 may be generally aligned with the printhead features 16 of the bottom electrodes. While in the uncured state, the spacer layer 36 is substantially tack-free and may be easily moved relative to bottom electrodes 10 for proper alignment.

Figure 3B:
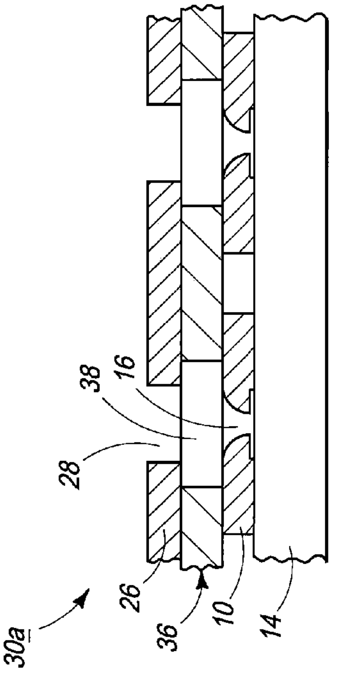

Referring to FIG. 3B, the fragment 30*a* is shown at a subsequent processing step where top electrodes 26 are provided over the spacer layer 36. In one embodiment, top electrodes 26 are implemented using a continuous layer of conductive material which comprises printhead features 28 (e.g., openings) corresponding to printhead features 16, 38. In one embodiment, top electrodes 26 are individually electroformed Nickel with a thickness of 25-45 um and fabricated with substantially straight walled cylindrical printhead features 28 which are 25-100 um in diameter. In another embodiment, electrodes 28 are chemically etched in Stainless Steel with printhead features 28 of approximately 125 microns.

The top electrodes 26 are provided over the spacer layer 36 which remains in the uncured state in one embodiment. As mentioned above, while in the uncured state, the spacer layer 36 is substantially tack-free and may be easily moved relative to bottom electrodes 10 and top electrodes 26 may be easily moved relative to spacer layer 36. In one embodiment, the printhead features 28 of the top electrodes 26 and the printhead features 38 of the spacer layer 36 are aligned with the printhead features 16 of the bottom electrodes 10. In a more specific example, the top electrodes 26 and spacer layer 36 may each be initially manually moved, for example using metal fingers or pins 50, and aligned with bottom electrodes 10. Following the initial alignment, the assembly may be observed under a microscope and a micrometer used to suitably move the top electrodes 26 and spacer layer 36 to align the printhead features 28, 38 of the top electrodes 26 and spacer layer 36 with respect to printhead features 16 of the bottom electrodes 10 to form the printhead structures in the form of nozzles 22 in the described example. In other embodiments, the bottom electrodes 10 may be moved to achieve alignment.

Figure 3C:
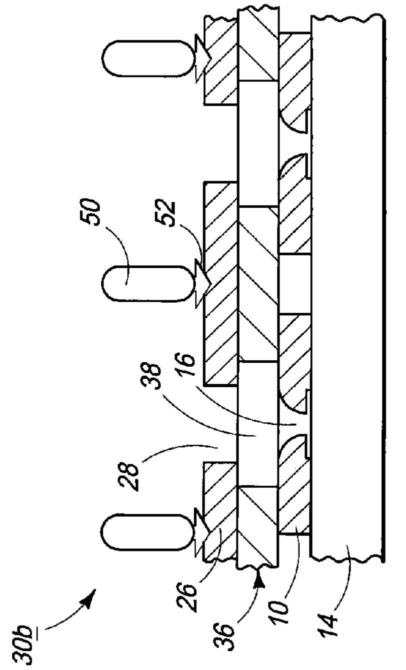
Figure 3D:
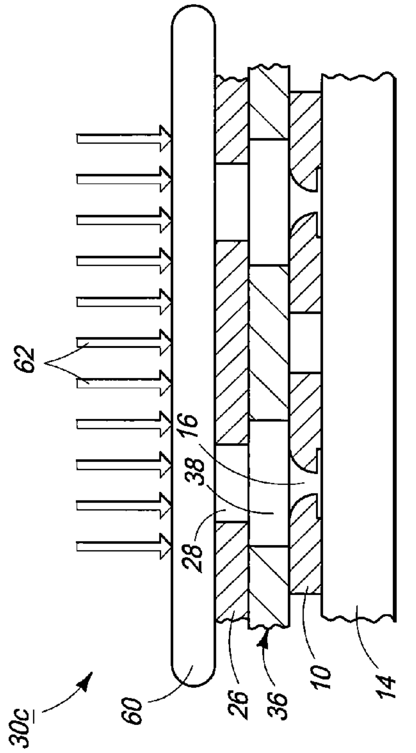

Following alignment of the printhead features 28, 38 of the top electrodes 26 and spacer layer 36 with the printhead features 16 of the bottom electrodes 10, processing of the fragment 30*b* of the printhead assembly may proceed as shown in FIGS. 3C and 3D where the spacer layer 36 is bonded to the bottom and top electrodes 10, 26. In one embodiment, the bonding occurs in plural acts corresponding to FIGS. 3C and 3D. As described in more detail below, the processing of FIG. 3C initially bonds a plurality of different portions of the spacer layer 36 with respect to the bottom and top electrodes 10, 26 at a plurality of different locations. In particular, the processing of FIG. 3C attempts to impart no lateral forces to the assembly being bonded while substantially fixing the positional relationship of the spacer layer 36 with respect to the bottom and top electrodes 10, 26. After the positional relationship is fixed in FIG. 3C, additional bonding occurs in the processing of FIG. 3D wherein substantially an entirety of the spacer layer 36 is bonded with the bottom and top electrodes 10, 26.

In FIG. 3C, the positional relationships of the top electrodes 26, spacer layer 36 and bottom electrodes 10 may be fixed relative to one another. In one example, localized heat and pressure may be applied to a plurality of different locations of the printhead assembly to cure respective portions of the spacer layer 36. In one embodiment, the processing of FIG. 3C attempts to avoid subjecting the bottom and top electrodes 10, 26 and spacer layer 36 to lateral forces which may cause misalignment of the bottom and top electrodes 10, 26 and spacer layer 36. For example, in one embodiment, the processing of FIG. 3C subjects the printhead assembly to reduced lateral forces compared with the processing of FIG. 3D.

A plurality of metal fingers 50 may be heated and apply relatively low pressure to at least some of the top electrodes 26 at respective portions of the printhead assembly to cure the respective portions of the spacer layer 36. In one embodiment, fingers 50 may be heated to approximately 100-150° C. and applied with pressures ranging from 20 to 100 kPa for a few seconds. The curing of portions of the spacer layer 36 forms a plurality of localized weld points to bond the respective portions of the spacer layer 36 with respect to the top electrodes 26 and bottom electrodes 10. This processing of FIG. 3C subjects the printhead assembly to reduced lateral forces (e.g., compared with full lamination processing) which may result in reduced mis-alignment.

Following the initial fixing of alignment of the top electrodes 26, spacer layer 36, and bottom electrodes 10 in FIG. 3C, the processing of the fragment 30*c* of the printhead assembly may proceed as shown in FIG. 3D. In FIG. 3D, the printhead assembly may be subjected to additional full lamination processing to further cure the spacer layer 36 and to provide additional bonding of the top electrodes 26 and the bottom electrodes 10 using the spacer layer 36. The lamination step of FIG. 3D is performed in one embodiment to create a strong bond of the spacer layer 36 to the top and bottom electrodes 10, 26 and provide a substantially void free printhead assembly along the bonding surfaces of the electrodes 10, 26 while also providing a substantially consistent spacing of the top and bottom electrodes 26, 10 in one embodiment. In one example, the spacer layer is entirely cured by the processing of FIG. 3D.

In one embodiment, the processing of FIG. 3D is implemented so as to avoid flowing the spacer layer 36 to maintain the uniform thickness of the spacer layer 36 and to provide consistent spacing between the top electrodes 26 and bottom electrodes 10. In one embodiment, the pressure, temperature and time of the processing of FIG. 3D is greater than the processing of FIG. 3C but not excessive to avoid flowing the spacer layer 36. In one more specific example, a laminating pressure 62 of approximately 20 kPa may be applied via a vacuum bag 60 at a temperature of 130 degrees C. for a duration of 10-15 min. In some embodiments, the support mandrel 14 may be provided upon a hot plate to assist with the processing of FIG. 3D. Other methods may be used in other embodiments.

In another example, the pressure lamination may be partial upon the support mandrel 14. More specifically, the temperature and pressure may be controlled to assure that the spacer layer 36 does not flow into printhead features 16 causing unwanted adhesive to the mandrel 14 while also providing a sufficient bond and permitting the printhead assembly to be peeled from the mandrel 14 while the bonds of the spacer layer 36 and electrodes 10, 26 remain intact. In one embodiment, lamination pressures on the order of 20-40 kPa with lamination temperatures of 130° C. for approximately 10-20 minutes may be used followed by air heating for approximately 4 min at 140° C.

Following the intermediate lamination and removal of the printhead assembly from the mandrel 14, full lamination described above may be performed to complete the bonding of the spacer layer 36 with the top electrodes 26 and bottom electrodes 10. In one arrangement, the full lamination in this alternative example may be performed after the printhead assembly has been provided upon a substrate assembly described below. Other methods of aligning and bonding the top electrodes 26, spacer layer 36 and bottom electrodes 10 are possible.

Figure 4:
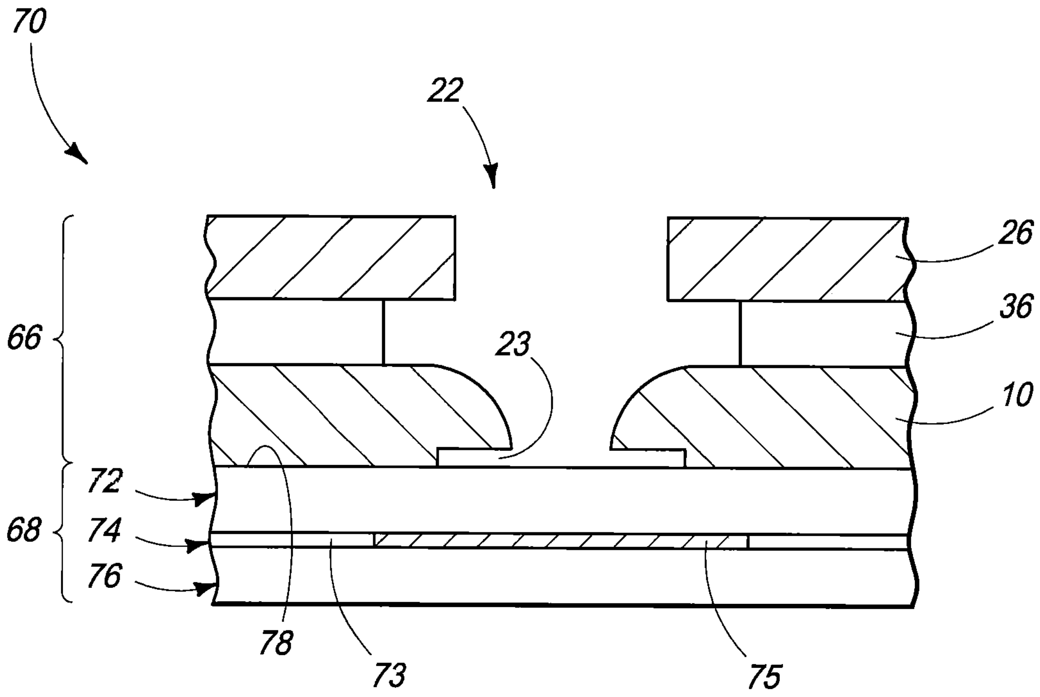
FIG. 4 is a cross-sectional view of a printhead structure of a printhead according to one embodiment.

Referring to FIG. 4, a fragment 70 of a portion of a printhead is shown. The printhead includes a printhead assembly 66 (e.g., fabricated above in FIGS. 3A-3D in one embodiment) comprising the nozzle 22 and which is mounted upon a substrate assembly 68. In one embodiment, the printhead assembly 66 has been completely bonded in FIG. 4 where the spacer layer 36 has been completely bonded to adjoining surfaces of the top electrodes 26 and bottom electrodes 10.

Substrate assembly 68 supports the printhead assembly 66 in the illustrated embodiment. The example substrate assembly 68 includes a support layer 72, circuitry layer 74 and substrate layer 76 in the depicted embodiment.

In one embodiment, the support layer 72 may comprise dielectric material, such as R21-2615 silicone rubber available from NuSil Technology mixed with a $TiO_2$ composition having designation MED3-4102 and which is also available from NuSil Technology. In one embodiment, MED3-4102 provides $TiO_2$ (75% by weight) in a silicone oil which is mixed with the silicone rubber so that the final mixture has a 40% $TiO_2$ concentration by volume. In one example, the mixture is diluted at a ratio of 1:30 into a solvent (e.g., Xylene) to provide a relatively low viscosity coating. The material may be applied over circuitry layer 74 by a roller or blade coater to provide a layer having an initial thickness of approximately 40 microns and which is approximately 20-25 microns after evaporation of the solvent and with uniformity of better than 1 micron in one embodiment.

Circuitry layer 74 includes conductive circuitry 75 and dielectric material 73 in the illustrated embodiment. Substrate layer 76 may be a PC board or other suitable substrate in example embodiments. Support layer 72 has a substantially flat upper surface 78 to bond with printhead assembly 66 in one embodiment. Additional details regarding substrate assembly 68 are discussed in a co-pending application entitled "Printhead Fabrication Methods, Printhead Substrate Assembly Fabrication Methods, And Printheads" listing Napoleon J. Leoni and Omer Gila as inventors, published on May 10, 2012 as U.S. Patent Publication 2012/0169823, and filed the same day as the present application.

In one embodiment, printhead assembly 66 may undergo the processing of FIGS. 3A-3D upon mandrel 14 or other support structure prior to bonding with substrate assembly 68 to form the printhead. In another embodiment, one or more of the steps of FIGS. 3A-3D may be performed upon substrate assembly 68 or other support structure.

As mentioned above, substrate assembly 68 includes a circuitry layer 74. Nozzles 22 of printhead assembly 66 may be aligned with conductive circuitry 75 during bonding of printhead assembly 66 and substrate assembly 68 to provide an operable printhead in one embodiment. For example, in one arrangement, nozzles 22 may be aligned with the circuitry 75 comprising respective RF electrodes in the circuitry layer 74. In one embodiment, appropriate biasing and control signals may be provided to bottom and top electrodes 10, 26 and circuitry 75 to cause the emission of electrons from nozzle 22 to form latent images upon an opposing photoconductive surface (e.g., surface or belt) which may be developed with a marking agent and transferred to media to form hard copy images in one embodiment.

Figure 5:
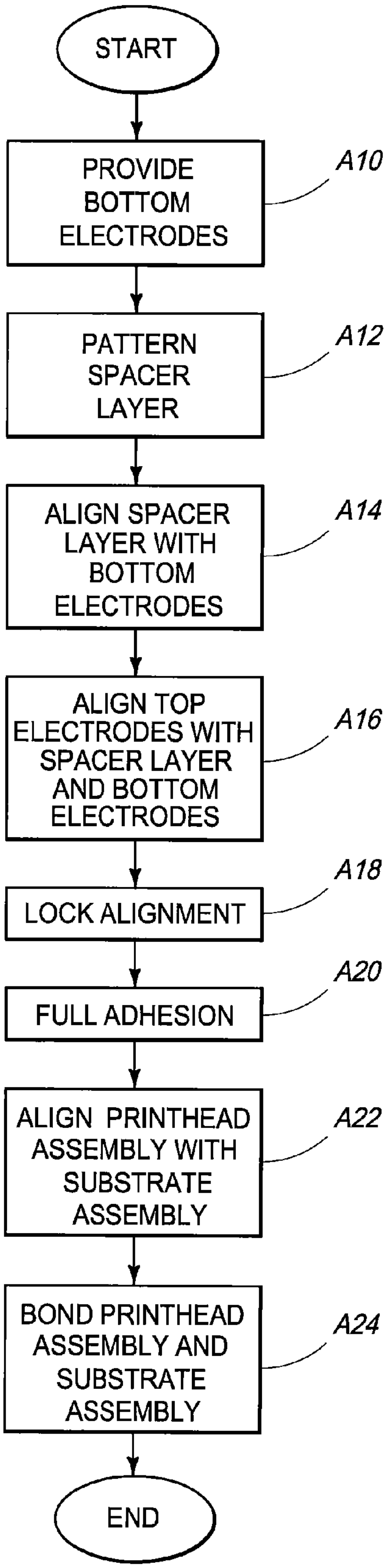
FIG. 5 is a flow chart of a method of fabricating a printhead according to one embodiment.

Referring to FIG. 5, a method of forming a printhead is shown according to one embodiment. Other methods are possible including more, less or alternative acts or acts arranged according to different orders.

At an act A10, a bottom electrode is provided upon a support structure, such as support mandrel. The bottom electrode includes a plurality of printhead features corresponding to a plurality of respective printhead structures to be formed in the printhead in one embodiment.

At an act A12, a spacer layer is patterned. In one embodiment, a laser is used to form a plurality of printhead features in the spacer layer which correspond to the printhead features of the bottom electrodes.

At an act A14, the prepatterned spacer layer is aligned with the bottom electrodes. In a more specific example, the printhead features of the spacer layer are aligned with the printhead features of the bottom electrodes.

At an act A16, a plurality of top electrodes are aligned with the spacer layer and bottom electrodes. In a more specific example, a plurality of printhead features in the top electrodes are aligned with a plurality of printhead features in the spacer layer and the bottom electrodes to form a plurality of nozzles according to one embodiment of the printhead.

At an act A18, the alignment of the printhead features of the top electrodes, spacer layer and bottom electrodes is locked. In one embodiment, a plurality of portions of the spacer layer comprising an adhesive are cured to provide a plurality of weld points sufficient to maintain the positional alignment of the top electrodes, spacer layer and bottom electrodes with respect to one another.

At an act A20, the top electrodes, spacer layer and bottom electrodes are fully bonded to one another in one embodiment to form the printhead assembly. In one embodiment, substantially entireties of the surfaces of the spacer layer are bonded with the adjoining surfaces of the top electrodes and bottom electrodes.

At an act A22, the printhead assembly is aligned with a substrate assembly. In one embodiment, circuitry of the substrate assembly is aligned with the printhead features of the printhead assembly.

At an act A24, the aligned printhead assembly and substrate assembly are bonded to one another to form a printhead according to one embodiment. In one embodiment, this bonding procedure is in the form of a thermal lamination under a vacuum in which bottom electrode 10 adheres to a partially cured support layer 72.

In one more specific embodiment, the support layer of the substrate assembly is partially cured at approximately 105 degrees C. for 18 hours. Thereafter, the thermal lamination under vacuum processing may be implemented using pressures of approximately 20-40 kPa at 130 degrees C. for approximately 10-20 minutes followed by lamination processing at temperatures of 140 degrees C. for approximately 4 minutes in one embodiment.

As mentioned above, different methods of fabricating a printhead are possible. In one embodiment, acts A10-A20 may be performed on a support mandrel. In another embodiment, the top electrodes, spacer layer and the bottom electrodes may be removed from a support mandrel following the processing of act A18 and the processing of act A20 may be thereafter performed elsewhere on a different support member, such as substrate assembly, in one other example. In another example, acts A10-A20 may be performed upon the substrate assembly and the thermal lamination under a vacuum processing in act A20 my operate to bond the top electrodes, spacer layer and bottom electrodes as well as bond the printhead assembly and the substrate assembly in a single processing act and acts A22-A24 may be omitted. In such last illustrative example, the bottom electrodes may be attached to the support layer in act A10 after the partially cured processing of the support layer described above using a room temperature pressure lamination (e.g., approximately 400-600 kPa for approximately 5-20 seconds in one example).

At least some aspects of the present disclosure provide benefits over other prior methods for fabricating charge emitting printheads. In one other prior example, photolithography is used to pattern one or more layers, such as photoresist. More specifically, initially a dry film resist in an uncured, high tack state may be laminated onto one of the electrodes. The photoresist is exposed through a mask such that openings around nozzles of the printhead are left uncured and cured resist in a non-tacky state remains above the electrodes. Thereafter, a development phase would clean the uncured portions of the photoresist. However, drawbacks may result from an inability to completely remove uncured portions of the photoresist from the printhead assembly. For example, uncured photoresist may remain in the nozzles or undercuts described above (which undercuts may have relatively high aspects ratios of 2:1 in some embodiments) which may negatively affect print operations of the printhead. Some such methods may require access to both sides of the electrodes to properly flush uncured photoresist material. Furthermore, the number of suitable photoresist materials which also provide proper adhesion to other components of the printhead may be limited.

According to some aspects described herein, fabrication of the printhead assembly may be initiated while at least one of the electrodes (i.e., the bottom electrodes) are on a support mandrel, perhaps where they were formed, reducing chances of contamination. Furthermore, the bottom electrodes may be electroformed upon the support mandrel in some embodiments and the bottom electrodes may be aligned with respect to one another during their formation due to their adhesion to the surface of the support mandrel. In one arrangement, additional processing of the printhead assembly to provide the spacer layer and/or top electrodes may be performed upon the support mandrel with the bottom electrodes already provided thereon and in alignment with one another. Processing in accordance with some of the described example embodiments upon the support mandrel maintains relatively consistent inter-finger gaps between the bottom electrodes of different nozzles in one embodiment.

Additionally, use of a tack-free adhesive as the spacer layer during alignment according to some embodiments allows relatively free motion of the top electrodes, spacer layer and bottom electrodes with respect to one another permitting micrometer level alignment in some embodiments. Additionally, use of a thermally cured b-staged adhesive as the spacer layer in one embodiment enables localized welding via heating of the aligned top and bottom electrodes and spacer layer to reduce the chances of the final bonding disturbing the alignment.

According to some aspects of the disclosure, critical alignment between nozzles (e.g., having a nozzle spacing of 250-500 microns) is possible. Further, at least some aspects of the disclosure may achieve proper alignment between openings of the top and bottom electrodes to within +/− 2 microns providing relatively consistent current output per nozzle providing improved print quality compared with some other methods which cannot achieve this alignment. Furthermore, according to some embodiments, the use of a spacer layer provides consistent spacing between the top and bottom electrodes across the surface of the printhead which reduces current variation between nozzles providing improved print quality compared with arrangements which have variations in spacing between the top and bottom electrodes.

The protection sought is not to be limited to the disclosed embodiments, which are given by way of example only, but instead is to be limited only by the scope of the appended claims.

Further, aspects herein have been presented for guidance in construction and/or operation of illustrative embodiments of the disclosure. Applicant(s) hereof consider these described illustrative embodiments to also include, disclose and describe further inventive aspects in addition to those explicitly disclosed. For example, the additional inventive aspects may include less, more and/or alternative features than those described in the illustrative embodiments. In more specific examples, Applicants consider the disclosure to include, disclose and describe methods which include less, more and/or alternative steps than those methods explicitly disclosed as well as apparatus which includes less, more and/or alternative structure than the explicitly disclosed structure.

The invention claimed is:

1. A printhead fabrication method comprising:

providing a spacer layer over a plurality of bottom electrodes of a printhead;

providing a plurality of top electrodes of the printhead over the spacer layer and the bottom electrodes;

aligning a plurality of printhead features of the spacer layer with a plurality of printhead features of the top electrodes and the bottom electrodes; and bonding the spacer layer with the top electrodes and the bottom electrodes with the printhead features of the spacer layer aligned with the printhead features of the top electrodes and the bottom electrodes, wherein the bonding includes:

first bonding, while maintaining the alignment of the spacer layer relative to the top electrodes and the bottom electrodes, a plurality of different portions of the spacer layer with respect to the top and bottom electrodes at a plurality of different locations to form localized bonds without introducing lateral forces on the spacer layer during the first bonding; and after the first bonding, second bonding substantially an entirety of the spacer layer with the top and bottom electrodes while maintaining the localized bonds.

2. The method of claim 1 wherein the aligning comprises aligning the printhead features of the spacer layer with the printhead features of the top electrodes and the bottom electrodes to form a plurality nozzles which are configured to emit electrons to form a plurality of latent images during print operations of the printhead.

3. The method of claim 1 further comprising forming the printhead features in the spacer layer prior to the aligning.

4. The method of claim 1 wherein the aligning comprises moving at least one of the spacer layer, the top electrodes and the bottom electrodes relative to at least at least one other of the spacer layer, the top electrodes and the bottom electrodes with the spacer layer in a substantially uncured tack-free state.

5. The method of claim 1 wherein the aligning and bonding form a printhead assembly comprising the bottom electrodes, the top electrodes and the spacer layer, and further comprising coupling the printhead assembly with a substrate assembly to form the printhead.

6. A printhead fabrication method comprising:

aligning a spacer layer with a plurality of top electrodes and a plurality of bottom electrodes;

at a first moment in time with the spacer layer aligned with the top and bottom electrodes, fixing a positional relationship of the spacer layer with respect to the top and bottom electrodes via curing a plurality of portions of the spacer layer to form localized bonds of the spacer layer to the top electrodes and the bottom electrodes to fix positional relationships of the spacer layer, the top electrodes and the bottom electrodes with respect to one another; and at a second moment in time after the fixing, performing additional bonding of the spacer layer with the top and bottom electrodes.

7. The method of claim 6 wherein aligning comprises aligning a plurality of printhead features in the spacer layer with a plurality of printhead features in the top and bottom electrodes, and wherein at least some of the printhead features of the spacer layer comprise an opening and at least some of the printhead features of the top electrodes and the bottom electrodes comprise an opening.

8. The method of claim 7 further comprising forming the printhead features in the spacer layer before the aligning.

9. The method of claim 6 wherein the additional bonding bonds substantially an entirety of the spacer layer with respect to the top and bottom electrodes.

10. The method of claim 9 wherein the aligning comprises moving at least one of the spacer layer, the top electrodes and the bottom electrodes relative to at least at least one other of the spacer layer, the top electrodes and the bottom electrodes with the spacer layer in a substantially uncured tack-free state.

11. A printhead comprising:

a plurality of bottom electrodes comprising a plurality of printhead features;

a plurality of top electrodes comprising a plurality of printhead features, wherein the printhead features of the top electrodes are aligned with the printhead features of the bottom electrodes; and a spacer layer intermediate the top and bottom electrodes, having a plurality of printhead features aligned with the printhead features of the top electrodes and the bottom electrodes, and configured to space the top electrodes from the bottom electrodes to form a plurality of nozzles comprising respective ones of the top electrodes and the bottom electrodes, and wherein the nozzles are configured to emit electrons to form a plurality of latent images during imaging operations of the printhead, wherein the spacer layer comprises a first bonding structure including a plurality of localized, cured bonding points relative to the bottom electrodes and the top electrodes to maintain alignment, and to fix positional relationships, of the bottom electrodes, the top electrodes, and the spacer layer with respect to one another without bonding substantially the entire spacer layer, the top electrodes, and the bottom electrodes relative to each other.

12. The printhead of claim 11 wherein the bottom electrodes, the top electrodes and the spacer layer comprise a printhead assembly, and further comprising a substrate assembly coupled with the printhead assembly, and wherein the bottom electrodes are aligned with circuitry of the substrate assembly.

13. The printhead of claim 11 wherein the spacer layer is configured to provide a substantially uniform distance between the bottom electrodes and the top electrodes.

14. The method of claim 2, wherein each printhead feature of the spacer layer comprises an opening and each printhead feature of the respective top and bottom electrodes comprise an opening.

15. The method of claim 1, wherein the first bonding includes applying heat and pressure via a plurality of metal fingers arranged in correspondence to the plurality of locations to at least some of the top electrodes to cause curing of the spacer layer to form the localized bonds.

16. The method of claim 6, wherein the curing includes applying heat and pressure via a plurality of metal fingers arranged in correspondence to the plurality of locations to at least some of the top electrodes to cause curing of the spacer layer to form the localized bonds.

17. The printhead of claim 11, wherein the spacer layer comprises a second bonding structure including a complete bonding of the spacer layer, the top electrodes, and the bottom electrodes relative to each other, wherein the complete bonding surrounds and incorporates the first bonding structure.

18. The printhead of claim 17, wherein the printhead features of the top electrodes, of the bottom electrodes, and of the spacer layer comprise openings.

* * * * *

UNITED STATES PATENT AND TRADEMARK OFFICE

CERTIFICATE OF CORRECTION

PATENT NO. : 8,736,645 B2
APPLICATION NO. : 13/382805
DATED : May 27, 2014
INVENTOR(S) : Napoleon J. Leoni et al.

It is certified that error appears in the above-identified patent and that said Letters Patent is hereby corrected as shown below:

In the Claims:

In column 9, line 17, in Claim 2, delete "plurality" and insert -- plurality of --, therefor.

In column 9, line 24, in Claim 4, delete "at least at least" and insert -- at least --, therefor.

In column 10, line 1, in Claim 10, delete "at least at least" and insert -- at least --, therefor.

Signed and Sealed this
Ninth Day of September, 2014

Michelle K. Lee

Michelle K. Lee
*Deputy Director of the United States Patent and Trademark Office*